United States Patent [19]

Cho

[11] Patent Number: 5,087,485
[45] Date of Patent: Feb. 11, 1992

[54] ISOPROPANOL CATALYST FOR COPPER CHEMICAL VAPOR DEPOSITION

[75] Inventor: Chih-Chen Cho, Richardson, Tex.

[73] Assignee: Texas Instruments Incorporated, Dallas, Tex.

[21] Appl. No.: 567,491

[22] Filed: Aug. 14, 1990

[51] Int. Cl.$^5$ .................... C23C 16/18; C23C 16/20
[52] U.S. Cl. .................... 427/253; 427/250; 427/252; 427/255.1
[58] Field of Search ............... 427/250, 251, 252, 253, 427/255.1

[56] References Cited

U.S. PATENT DOCUMENTS 4,948,623  8/1990  Beach et al. .................... 427/35

FOREIGN PATENT DOCUMENTS 1049572  10/1983  U.S.S.R. .................... 427/252

OTHER PUBLICATIONS

Houle et al., J. Vac. Sci. Tech. A4(6), Nov./Dec. 1986, pp. 2452-2458.

*Primary Examiner*—Shrive Beck
*Assistant Examiner*—Margaret Burke
*Attorney, Agent, or Firm*—Richard A. Stoltz; Rene E. Grossman; Richard L. Donaldson

[57] ABSTRACT

An alcohol having an alpha hydrogen with the remaining groupings attached to the carbon atom being either hydrogen or an alkyl group having from 1 to 5 carbon atoms, preferably isopropanol, is added to the flow stream of a copper chelate gas, preferably a copper diketonate, the copper diketonate preferably being $Cu(hfac)_2$ or a composition identical thereto wherein one or more of the fluorine atoms is replaced by one of hydrogen atoms, and alkyl group having from one to five carbon atoms and a gas, preferably a reducing agent, preferably hydrogen. As a second embodiment, some or all of the copper can be replaced by aluminum to provide either $Al(hfac)_3$ or a combination of $Cu(hfac)_2$ and $Al(hfac)_3$. While the flow rates of each of the components is not critical and will vary with materials used and conditions, a flow rate for the reducing agent of from about 15 to about 60 SCCM and preferably 20 SCCM is appropriate with the amount of alcohol and metal chelate entering the flow stream being determined by the vapor pressure of the material involved. The flow stream enters as standard CVD reactor wherein the sample to be coated with copper is heated, thereby causing the copper to be deposited only on the heated area. The other reaction products are gaseous and are removed from the reactor by means of a pump or the like as is well known.

34 Claims, 1 Drawing Sheet

ISOPROPANOL CATALYST FOR COPPER CHEMICAL VAPOR DEPOSITION

BACKGROUND OF THE INVENTION

1. Field of the Invention

This invention relates to chemical vapor deposition of copper and, more specifically, to such chemical vapor deposition

2. Brief Description of the Prior Art

Aluminum has been widely used as the metallic material for gates and interconnects for most integrated circuits. However, as the feature dimensions of electronic devices continue to decrease, the metallic material requires continually higher electrical conductivity and better resistivity to the electromigration problem than is presently available with aluminum. Copper has been widely considered as a good new material to meet these requirements because it ha higher conductivity and lower resistivity than does aluminum.

Copper films can be grown by either electroplating, electroless plating, sputtering or chemical vapor deposition (CVD). Films formed by chemical vapor deposition usually have better conformity than those formed by sputtering and less contamination problems than those formed by wet processing methods.

Copper hexafluoroacetylacetonate (referred to hereinafter as $Cu(hfac)_2$) and hydrogen have been used as the reaction agents during copper CVD as set forth in an article of N. Awaya et al., "Selective Chemical Vapor Deposition of Copper", Proceedings of VLSI Symposium, Kyoto, May 1989, page 103. When the sample temperature was 250° to 400° C., copper was deposited on metals and metal silicides while no copper nuclei were observed on $SiO_2$ or $Si_3N_4$.

Copper(II) hexafluoroacetylacetonate and alcohols have been used to produce metallic copper. This has been reported in an article of H. D. Gafney et al., "Photochemical Reactions of Copper (II)-1,3-diketonate complexes", Journal of the American Chemical Society, 93 (1971), pg. 1623. In this article, $Cu(hfac)_2$ and several other copper chelates were irradiated by 254 nm UV light in various alcohol "solutions". Copper metal is produced in the solutions. This study focuses on the photochemical effects of the copper chelates. Although the quantum yield was found to be temperature dependent from 3° to 26° C., it was explained by the assumption that a thermal reaction was involved in the reaction mechanism after UV photons created an intermediate to form copper. Because the reaction temperature was so low (3° to 26° C.), the possibility of a completely thermal-driven reaction was not considered.

In an article of F. A. Houle et al, "Surface Processes Leading to Carbon Contamination of Photochemically Deposited Copper Films", Journal of Vacuum Science Technology, A4 (1986), page 2452, bis-(1,1,1,5,5,5-hexafluoropentanedionate) copper (II), which is another name for $Cu(hfac)_2$, and its ethanolate were used to grow copper using either an argon ion laser (257 nm), a KrF laser (248 nm) or a mercury arc lamp. Copper purity was improved when ethanol was used.

In the above described Gafney and Houle articles, the UV photons did not raise the substrate temperature enough to induce a thermal reaction. Furthermore, the use of ultraviolet photons to initiate the copper deposition reaction is relatively inefficient, requires a relatively high surface temperature on the surface on which deposition is to take place and requires a window in the reaction chamber for passage of ultraviolet light into the reaction chamber whereon copper will deposit. This requires periodic cleaning of the window in order to permit the ultraviolet light to penetrate therethrough, this requiring a periodic shut down of the deposition equipment with attendant economic penalties attached thereto.

SUMMARY OF THE INVENTION

In accordance with the present invention, the above noted problems of the prior art as well as other problem are minimized or eliminated.

Briefly, in accordance with the present invention, an alcohol having an alpha hydrogen with the remaining groupings attached to the carbon atom being either hydrogen or an alkyl group having from 1° to 5 carbon atoms, preferably isopropanol, is added to the flow stream of a copper chelate gas, preferably a copper diketonate, the copper diketonate preferably being $Cu(hfac)_2$ or a composition identical thereto wherein one or more of the fluorine atoms is replaced by one of hydrogen atoms, an alkyl group having from one to five carbon atoms or chlorine and a gas, preferably a reducing agent, preferably hydrogen. As a second embodiment, some or all of the copper can be replaced by aluminum to provide either $Al(hfac)_3$ or a combination of $Cu(hfac)_2$ and $Al(hfac)_3$. While the flow rates of each of the components is not critical and will vary with materials used and conditions, a flow rate for the reducing agent of from about 15 to about 60 SCCM and preferably 20 SCCM is appropriate with the amount of alcohol and metal chelate entering the flow stream being determined by the vapor pressure of the material involved. The flow stream enters a standard CVD reactor wherein the sample to be coated with copper is heated, thereby causing the copper to be deposited only on the heated area. The other reaction products are gaseous and are removed from the reactor by means of a pump or the like as is well known.

In accordance with the present invention, copper is deposited having higher nucleation and deposition rates than in the prior art. Copper deposition from the CVD process without isopropanol required higher vapor concentration of $Cu(hfac)_2$ to nucleate. To obtain the same growth rate, the CVD process with no isopropanol has to maintain the vapor concentration of $Cu(hfac)_2$ about two order of magnitude higher than the CVD process with isopropanol. Also, the copper can be deposited on $SiO_2$ at low temperatures. With isopropanol, copper is deposited on $SiO_2$ when the $SiO_2$ substrate temperature is held as low as 160° C. Without isopropanol, the substrate temperature must be held above 400° C. to deposit copper onto $SiO_2$ from $Cu(hfac)_2$ and hydrogen. Furthermore, the deposition rate onto metal is enhanced. When patterned Al/Si or patterned $Al/SiO_2$ samples are used as the substrate, a copper film is grown on aluminum while only very few copper particles are found on silicon or $SiO_2$. In addition, there is an improvement in reliability. The deposition process with isopropanol is more reproducible. The deposition process without isopropanol is more sensitive to substrate surface treatment and requires better control of the vapor concentration of $Cu(hfac)_2$. Another advantages obtained by the use of isopropanol is reduction of particle contamination. Because solid $Cu(hfac)_2$ is used to supply gaseous $Cu(hfac)_2$, some small $Cu(hfac)_2$ particles may be carried into the reactor and act as a contaminant. Use of copper in a Cu(hfac)$_2$ solution as the source diminishes this problem.

BRIEF DESCRIPTION OF THE DRAWING

The FIGURE is a schematic diagram of a CVD reactor and gaseous flow stream thereto as used in accordance with the present invention.

DESCRIPTION OF THE PREFERRED EMBODIMENT

Figure 1:
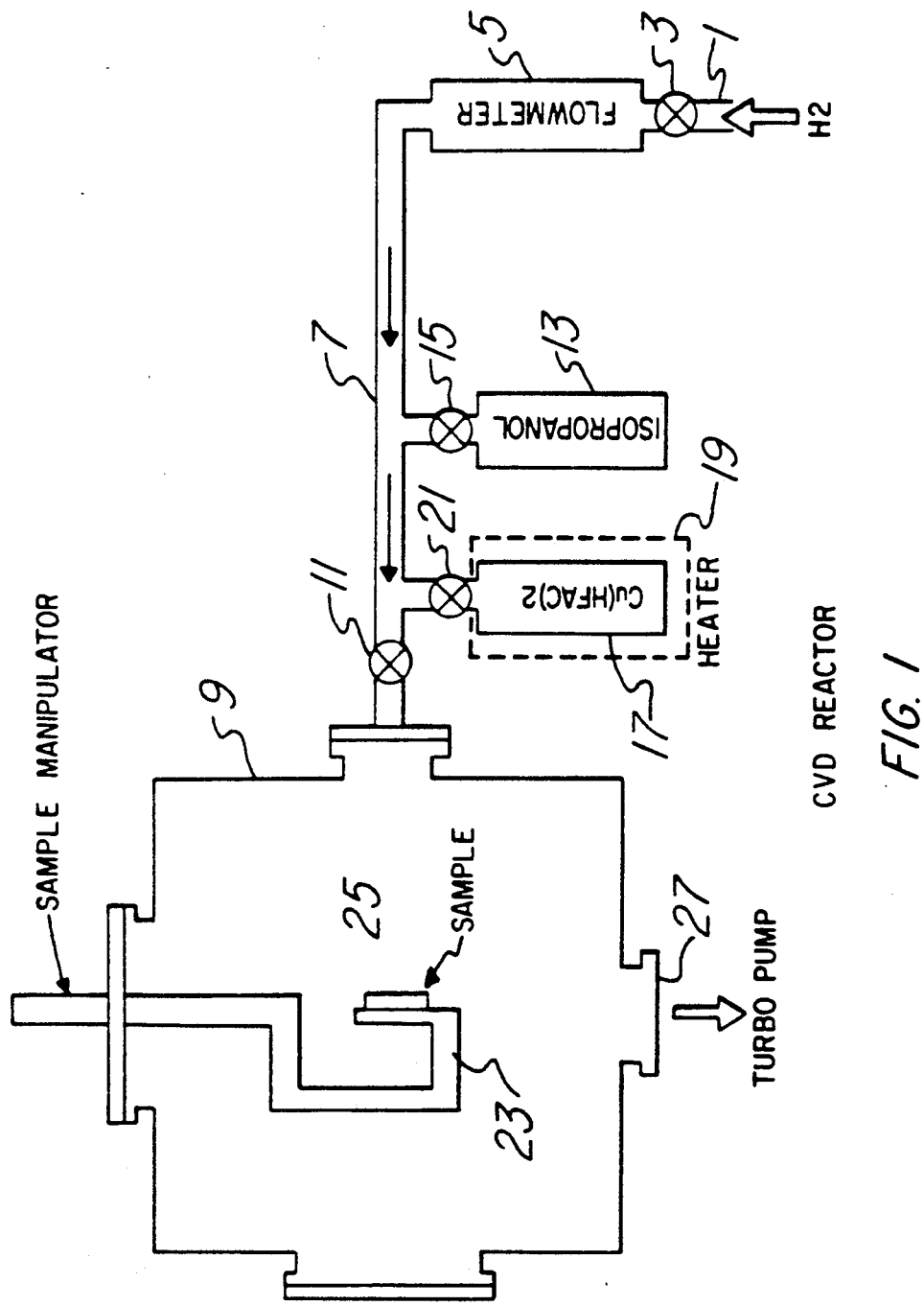

Referring now to the FIGURE, there is shown a hydrogen gas input 1, the flow rate of which is controlled by a valve 3 with a flowmeter 5 indicating the flow rate of the hydrogen. The preferred flow rate is 20 SCCM. The hydrogen passes along a conduit 7 to a CVD reactor 9 through a valve 11. A container 13 contains isopropanol therein and opens to the conduit 7 via a valve 15. The amount of isopropanol entering the conduit 7 is determined by the vapor pressure of the isopropanol. A container 17 which is heated to a temperature of 45° C. or higher by a heater 19 contains Cu(hfac)$_2$ which is vaporized due to the heat applied thereto and travels to the conduit 7 via a valve 21. The result is that the combined hydrogen, isopropanol and Cu(hfac)$_2$ enter the CVD reactor 9 for deposition of copper on a sample.

Within the reactor 9 is a sample holder 23 on which is positioned a sample 25 on which copper is to be deposited. The sample 25 is initially heated by passing current through a graphite heater which heats the sample to a temperature of 225° C. or higher but below the melting point of silicon in the case of a silicon sample, to a temperature of 160° C. or higher in the case of an SiO$_2$ sample and to a temperature of 200° C. but less than the melting point in the case of a metal. When the sample reaches the desired temperature, the gas flow from the conduit 7 through valve 11 is turned on. The gases react within the reactor 9 at the locations of elevated temperature, these being at the sample 25 with the copper being deposited on the sample and the other reaction products being removed from the reactor by means of a pump from the outlet 27.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

I claim:

1. A method of CVD deposition of copper on a surface comprising the steps of:
   (a) providing said surface;
   (b) heating said surface; and
   (c) applying to said heated surface a mixture of a carrier gas, a gaseous copper chelate and a gaseous alcohol having an alpha hydrogen with the remaining groupings attached to the carbon atom being either hydrogen or an alkyl group having from 1 to 5 carbon atoms, wherein the dissociation of the copper chelate occurs by thermal means.

2. The method of claim 1, further including placing said surface in a CVD reactor prior to said heating, said heating taking place within said reactor and said mixture being supplied into said reactor.

3. The method of claim 1 wherein said copper chelate is a copper diketonate.

4. The method of claim 2 wherein said copper chelate is copper diketonate.

5. The method of claim 3 wherein said copper diketonate is Cu(hfac)$_2$ or a composition similar thereto wherein one or more of the fluorine atoms is replaced by one of hydrogen atoms, an alkyl group having from one to five carbon atoms or chlorine 6. The method of claim 4 wherein said copper diketonate is Cu(hfac)$_2$ or a composition similar thereto wherein one or more of the fluorine atoms is replaced by one of hydrogen atoms, an alkyl group having from one to five carbon atoms or chlorine 7. The method of claim 1 wherein said alcohol is isopropanol.

8. The method of claim 2 wherein said alcohol is isopropanol.

9. The method of claim 3 wherein said alcohol is isopropanol.

10. The method of claim 4 wherein said alcohol is isopropanol.

11. The method of claim 5 wherein said alcohol is isopropanol.

12. The method of claim 6 wherein said alcohol is isopropanol.

13. The method of claim 1 wherein said carrier gas is hydrogen.

14. The method of claim 2 wherein said carrier gas is hydrogen.

15. The method of claim 4 wherein said carrier gas is hydrogen.

16. The method of claim 6 wherein said carrier gas is hydrogen.

17. The method of claim 10 wherein said carrier gas is hydrogen.

18. The method of claim 12 wherein said carrier gas is hydrogen.

19. The method of claim 1 wherein said step of heating said surface includes heating said surface to a temperature of at least about 160° C. in the case of a SiO$_2$ or Si$_3$N$_4$ substrate, at least 225° C. in the case of a silicon surface and at least 200° C. and less than the melting temperature of the metal in the case of a metal surface.

20. The method of claim 8 wherein said step of heating said surface includes heating said surface to a temperature of at least about 160° C. in the case of a SiO$_2$ or Si$_3$N$_4$ substrate, at least 225° C. in the case of a silicon surface and at least 200° C. and less than the melting temperature of the metal in the case of a metal surface.

21. The method of claim 12 wherein said step of heating said surface includes heating said surface to a temperature of at least about 160° C. in the case of a SiO$_2$ or Si$_3$N$_4$ substrate, at least 225° C. in the case of a silicon surface and at least 200° C. and less than the melting temperature of the metal in the case of a metal surface.

22. The method of claim 18 wherein said step of heating said surface includes heating said surface to a temperature of at least about 160° C. in the case of a SiO$_2$ or Si$_3$N$_4$ substrate, at least 225° C. in the case of a silicon surface and at least 200° C. and less than the melting temperature of the metal in the case of a metal surface.

23. The method of claim 19 wherein the flow rate of said carrier is from about 15 to about 60 SCCM and wherein said copper chelate is heated to a temperature of at least 45° C.

24. The method of claim 20 wherein the flow rate of said carrier is from about 15 to about 60 SCCM and wherein said copper chelate is heated to a temperature of at least 45° C.

25. The method of claim 21 wherein the flow rate of said carrier is from about 15 to about 60 SCCM and wherein said copper chelate is heated to a temperature of at least 45° C.

26. The method of claim 22 wherein the flow rate of said carrier is from about 15 to about 60 SCCM and wherein said copper chelate is heated to a temperature of at least 45° C.

27. A method of CVD deposition of at least one of copper and aluminum on a surface comprising the steps of:
   (a) providing said surface;
   (b) heating said surface; and
   (c) applying to said heated surface a mixture of a carrier gas, at least one of a gaseous copper chelate and a gaseous aluminum chelate and a gaseous alcohol having an alpha hydrogen with the remaining groupings attached to the carbon atom being either hydrogen or an alkyl group having from 1 to 5 carbon atoms.

28. The method of claim 27 wherein said copper chelate is a copper diketonate and said aluminum chelate is an aluminum diketonate.

29. The method of claim 27 wherein said carrier gas is hydrogen.

30. The method of claim 28 wherein said carrier gas is hydrogen.

31. The method of claim 27 wherein said alcohol is isopropanol.

32. The method of claim 28 wherein said alcohol is isopropanol.

33. The method of claim 29 wherein said alcohol is isopropanol.

34. The method of claim 30 wherein said alcohol is isopropanol.

* * * * *